(12) United States Patent
Murata

(10) Patent No.: US 6,586,274 B2
(45) Date of Patent: Jul. 1, 2003

(54) SEMICONDUCTOR DEVICE, SUBSTRATE FOR A SEMICONDUCTOR DEVICE, METHOD OF MANUFACTURE THEREOF, AND ELECTRONIC INSTRUMENT

(75) Inventor: Akihiro Murata, Takane-cho (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/944,218

(22) Filed: Sep. 4, 2001

(65) Prior Publication Data

US 2002/0030266 A1 Mar. 14, 2002

Related U.S. Application Data

(62) Division of application No. 09/250,284, filed on Feb. 16, 1999.

(30) Foreign Application Priority Data

Feb. 17, 1998 (JP) ............................... 10-051357
Nov. 16, 1998 (JP) ............................... 10-342368

(51) Int. Cl.$^7$ ........................... H01L 21/44; H01L 21/48
(52) U.S. Cl. ..................... 438/106; 438/111; 438/112; 438/115; 438/117
(58) Field of Search ..................... 438/106–112, 117, 438/116, 115

(56) References Cited

U.S. PATENT DOCUMENTS

| 5,316,787 A | | 5/1994 | Frankeny et al. | |
|---|---|---|---|---|
| 5,397,917 A | | 3/1995 | Ommen et al. | 257/700 |
| H1471 H | | 8/1995 | Braun et al. | |
| 5,509,200 A | | 4/1996 | Frankeny et al. | |
| 5,581,122 A | | 12/1996 | Chao et al. | 257/691 |
| 5,615,477 A | * | 4/1997 | Sweitzer | 228/180.22 |
| 5,635,671 A | * | 6/1997 | Freyman et al. | 174/52.2 |
| 5,640,047 A | | 6/1997 | Nakashima | 257/738 |
| 5,808,873 A | | 9/1998 | Celaya et al. | 361/760 |
| 5,872,338 A | * | 2/1999 | Lan et al. | 174/255 |
| 6,165,885 A | * | 12/2000 | Gaynes et al. | 257/737 |
| 6,228,676 B1 | * | 5/2001 | Glenn et al. | 438/106 |
| 6,400,010 B1 | * | 6/2002 | Murata | 257/675 |
| 6,408,510 B1 | * | 6/2002 | Hembree | 29/840 |
| 2001/0038144 A1 | * | 11/2001 | Grigg | 257/698 |
| 2002/0043402 A1 | * | 4/2002 | Juskey et al. | 174/260 |

FOREIGN PATENT DOCUMENTS

WO 94/22168 A1 9/1994

* cited by examiner

Primary Examiner—Michael S. Lebentritt
(74) Attorney, Agent, or Firm—Oliff & Berridge, PLC.

(57) ABSTRACT

A semiconductor device comprising a substrate including a metal portion and a resin portion and having a plurality of through holes formed in the resin portion, conductive members formed within the through holes, a semiconductor chip attached to one surface of the substrate, and a plurality of solder balls attached to the other surface of the substrate. The semiconductor chip and solder balls are electrically connected through the conductive members.

9 Claims, 11 Drawing Sheets

SEMICONDUCTOR DEVICE, SUBSTRATE FOR A SEMICONDUCTOR DEVICE, METHOD OF MANUFACTURE THEREOF, AND ELECTRONIC INSTRUMENT

This is a Division of application Ser. No. 09/250,284 filed Feb. 16, 1999. The entire disclosure of the prior application(s) is hereby incorporated by reference herein in its entirety.

BACKGROUND OF THE INVENTION

1. Field of the Invention

The present invention relates to a semiconductor device, a substrate for a semiconductor device, a method of manufacture thereof, and an electronic instrument.

2. Description of Related Art

With increasingly high functionality of semiconductor devices, there is a demand for higher pin count and more compactness, for which purpose Ball Grid Array (BGA) types and Chip Size/Scale Package (CSP) types of package have received attention. These packages have a wiring pattern and external terminals formed on a substrate, and a semiconductor chip is bonded to the wiring pattern, and sealed with resin.

Conventionally, a substrate used in these packages is formed of resin, as a result of which there are problems of inadequate flatness and heat dispersion. If the flatness is inadequate, faulty mounting on a mounting substrate may occur, and if the heat dispersion is inadequate the performance as a semiconductor device may be impaired. Therefore, a stiffener is adhered to the substrate for the purpose of ensuring flatness, and to assist heat dispersion a heat spreader is adhered.

Therefore, a package using the substrate commonly requires a stiffener and a heat spreader, and so there is the problem that the manufacturing cost is increased.

It should be noted that if a metallic substrate is used, the problems of flatness and heat dispersion are eliminated. However, with a metallic substrate, if the wiring pattern and external terminals are formed on opposite sides, it is difficult to achieve electrical insulation. That is to say, the wiring pattern and the external terminals are electrically connected through through holes formed in the substrate, and with a metallic substrate it is difficult to achieve electrical insulation within the through holes.

SUMMARY OF THE INVENTION

The present invention is made in consideration of these problems, and has as its object the provision of a semiconductor device, a substrate for a semiconductor device, a method of manufacture thereof, and an electronic instrument, such that a substrate of excellent flatness and heat dispersion is used, and moreover the manufacturing cost can be kept down.

(1) According to a first aspect of the present invention, there is provided a semiconductor device comprising:

a substrate for a semiconductor device, wherein the substrate includes a core layer formed of a metal that promotes heat dispersion, a through hole formation portion formed in the core layer, a plurality of through holes formed in the through hole formation portion, insulating layers formed on both sides of the core layer, and wires formed on the insulating layer and achieving electrical conductivity through the through holes from one surface to the other of the core layer; and a semiconductor chip provided on the substrate for a semiconductor device, and having electrodes electrically connected to the wires.

The flatness and heat dispersion of the substrate are ensured by the core layer. The wires electrically connecting both sides of the core layer are formed in through holes in the through hole formation portion, which is of a distinct material from the core layer, and therefore electrical insulation of the wires and core layer can be achieved. In this aspect of the present invention, as a metal promoting the dispersion of heat can be used a metal having a high thermal conductivity and a certain surface area.

(2) An opening may be formed in the core layer, and the through hole formation portion may be formed by filling this opening with an insulating material, and the through holes may be formed in this insulating material.

Since the area of the insulating material is defined by the opening, the through hole formation portion can be easily formed.

(3) As the insulating material may be used a resin.

(4) The opening may be formed in at least one of a peripheral portion and a central portion of the core layer.

In this way, there is no particular restriction on the position of the opening.

(5) The semiconductor chip may be disposed on the central portion of the core layer and may be also mounted over at least one of the through holes.

By the formation of the through holes under the semiconductor chip, a large number of through holes can be formed.

(6) The semiconductor chip may be mounted over the through hole through an adhesive. In this case, the function of air escape is facilitated by the through holes.

(7) As the adhesive may be used a thermally conductive material. In this case, heat transmitted from the adhesive is cooled in the through holes. (8) The through holes may be disposed in zigzag.

This makes it possible to form a large number of through holes, and the demand for high pin count can be met.

(9) The opening may be formed on the peripheral portion of the core layer along the edge of the core layer, with an opening length longer close to the peripheral portion than close to the central portion of the core layer. The through holes may be arranged in zigzag on a plurality of phantom lines that are imagined to be over the opening and to extend parallel to a longitudinal direction of the opening. The number of the through holes arranged on one of the phantom lines that is close to the edge of the core layer may be larger than the number of the through holes arranged on one of the phantom lines that is close to the central portion of the core layer.

By means of this, the opening can be formed with an opening length longer close to the periphery than close to the center region of the core layer. Therefore, a larger number of through holes can be formed in the opening close to the periphery of the core layer than close to the center of the core layer. Since the through holes are arranged in zigzag, wiring can be carried out easily. By disposing the through holes in zigzag, a large number of through holes can be formed, and as a result the demand for high pin count can be met.

(10) The wires may include inner leads extending from the through holes toward the central portion of the core layer, and connected to electrodes of the semiconductor chip.

Since the inner leads are drawn out from the zigzag through holes, the inner leads drawn out from the through holes formed close to the periphery of the core layer in the opening are made easier to avoid the through holes formed close to the center of the core layer.

(11) According to a second aspect of the present invention, there is provided a substrate for a semiconductor device, comprising:

a core layer formed of a metal that promotes heat dispersion;

a through hole formation portion formed in a part of the core layer;

a plurality of through holes formed in the through hole formation portion;

insulating layers formed on both sides of the core layer; and wires formed on the insulating layers and achieving electrical conductivity through the through holes from one surface to the other of the core layer.

According to this aspect of the present invention, the flatness and heat dispersion of the substrate are ensured by the core layer, and by virtue of the formation of the through holes in the through hole formation portion that is of a distinct material from the core layer, electrical insulation of the wires and core layer can be achieved. In this aspect of the invention, as a metal promoting heat dispersion can be used a metal having a high thermal conductivity and a certain surface area.

(12) An opening may be formed in the core layer, and the through hole formation portion may be formed by filling this opening with an insulating material, and the through holes may be formed in this insulating material.

Since the area of the insulating material is defined by the opening, the through hole formation portion can be easily formed.

(13) As the insulating material may be used a resin.

(14) The opening may be formed in at least one of a peripheral portion and a central portion of the core layer.

In this way, there is no particular restriction on the position of the opening.

(15) The through holes may be disposed in zigzag.

Since a large number of through holes can be formed in this substrate for a semiconductor device, this substrate can be used for a semiconductor device such that a high pin count is required.

(16) The opening may be formed on the peripheral portion of the core layer along the edge of the core layer, with an opening length longer close to the peripheral portion than close to the central portion of the core layer. The through holes may be arranged in zigzag on a plurality of phantom lines that are imagined to be over the opening and to extend parallel to a longitudinal direction of the opening. The number of the through holes arranged on one of the phantom lines that is close to the edge of the core layer may be larger than the number of the through holes arranged on one of the phantom lines that is close to the central portion of the core layer.

By means of this, the opening can be formed with an opening length longer close to the periphery than close to the center region of the core layer. Therefore, a larger number of through holes can be formed in the opening close to the periphery of the core layer than close to the center of the core layer. Since the through holes are formed in zigzag, wiring can be carried out easily. By disposing the through holes in zigzag, a large number of through holes can be formed, and as a result the demand for high pin count can be met.

(17) The wires may comprise inner leads extending from the through holes toward the central portion of the core layer, and plating leads extending from the through holes toward outside of the core layer.

The inner leads and plating leads are drawn out from the zigzag through holes. Therefore, the inner leads drawn out from the through holes formed close to the periphery of the core layer in the opening are made easier to avoid the through holes formed close to the center of the core layer. The plating leads drawn out from the through holes formed close to the center of the core layer in the opening are made easier to avoid the through holes formed close to the periphery of the core layer. It should be noted that here the plating leads are used when carrying out electroplating.

(18) A first opening may be formed in a central portion of the core layer, and a second opening may be formed in a peripheral portion of the core layer. The through hole formation portion may be formed by filling the first and second openings with an insulating material. A first group of the through-holes may be formed in zigzag in the insulating material within the first opening, and a second group of the through holes may be formed in zigzag in the insulating material within the second opening. A first group of the wires may be formed to extend from through holes of the first group to short of the second opening, and a second group of the wires may be formed to extend from through holes of the second group to short of the first opening, the first and second groups of wires being disposed in an alternating fashion.

(19) According to a third aspect of the present invention, there is provided a substrate for a semiconductor device comprising:

a core layer formed of a metal that promotes heat dispersion;

insulating layers formed on both sides of the core layer;

a plurality of through hole formation portions formed around each of a plurality of semiconductor chip mounting regions in the core layer;

a plurality of through holes formed on both sides of a central portion of each of the through hole formation portions;

a plating wire passing over the central portion of each of the through hole formation portions;

plating leads connecting from the plating wires to the through holes; and inner leads extending from the through holes to over the insulating layers outside the through hole formation portions.

The flatness and heat dispersion of the substrate are ensured by the core layer, and by virtue of the formation of the through holes in the through hole formation portion that is of a distinct material from the core layer, electrical insulation of the wires and core layer can be achieved.

A plurality of semiconductor chips can be mounted on this substrate, and by cutting in predetermined positions individual semiconductor devices can be fabricated. A plurality of through hole formation portions are formed around each semiconductor chip mounting region, a plurality of through holes are formed on both sides of a central portion of each through hole formation portion, and inner leads extend from the through holes. When this substrate for a semiconductor device is cut at the central portion of each through hole formation portion into single pieces, each of the single pieces has inner leads drawn out from the through holes. Plating leads are connected to the through holes, and the plating leads are each connected to the plating wire. Therefore, through the plating wire and plating leads, electroplating can be carried out on the inner leads. Moreover, since the plating wire is formed over the central portion of each through hole formation portion, if the substrate for a semiconductor device is cut up using a cut wider than the width of the plating wire in this position, the electrical connections among the plating leads are removed, and the inner leads are also no longer electrically connected. In this aspect of the invention, as a metal promoting heat dispersion can be used a metal having a high thermal conductivity and a certain surface area.

(20) Openings may be formed in the core layer; the through hole formation portions may be formed by filling the openings with an insulating material; and the through holes may be formed in the insulating material.

Since the area of the insulating material is defined by the openings, the through hole formation portions can be easily formed.

(21) According to a fourth aspect of the present invention, there is provided a method of manufacture of a semiconductor device, comprising the steps of:

providing a substrate including a metal portion and an insulating portion;

forming a plurality of through holes in the insulating portion;

providing a conductive member within each of the through holes;

attaching a semiconductor chip to one surface of the substrate;

providing external terminals on the other surface of the substrate; and forming wires electrically connecting the semiconductor chip and the external terminals through the conductive member, with an insulating layer interposed over the metal portion.

According to this aspect of the present invention, a semiconductor device can be obtained in which the flatness and heat dispersion of the substrate are ensured, and the electrical insulation between the conductive member and metal portion is achieved.

(22) The step of providing the substrate may include a step of forming a hole in a metal plate, and a step of forming the insulating portion in the hole.

In this way, a substrate including the metal portion and the insulating portion can be obtained.

(23) The step of providing the substrate and the step of forming the wires may be carried out by: providing an adhesive that is the material for the insulating portion and the insulating layer on both surfaces of the metal plate and within the holes; applying a metal foil that is the material for the wires; and etching the metal foil.

By simply applying the metal foil with the adhesive interposed, the insulating portion can be formed simply, and the wires can be formed on the metal portion with the insulating layer interposed.

(24) According to a fifth aspect of the present invention, there is provided a method of manufacture of a semiconductor device, comprising the steps of:

providing a substrate including a metal portion having a plurality of semiconductor chip mounting regions, and a plurality of insulating portions formed around each of the semiconductor chip mounting regions;

forming a plurality of through holes on both sides of a phantom line crossing each of the insulating portions;

forming wires including a plating wire extending along the phantom line of each of the insulating portions, plating leads connecting from the plating wire to the through holes, and inner leads extending from the through holes with an insulating layer interposed to over the metal portion;

providing a conductive member within each of the through holes;

attaching a plurality of semiconductor chips to one surface of the substrate and connecting electrodes of each of the semiconductor chips to the inner leads; and cutting the substrate into a plurality of single pieces while cutting away the plating wire.

A plurality of semiconductor chips can be mounted on the metal portion, and by cutting in predetermined positions individual semiconductor devices can be fabricated. A plurality of insulating portions are formed around each semiconductor chip mounting region. A plurality of through holes are formed on both sides of the phantom line crossing each insulating portion, and inner leads extend from the through holes. When this substrate is cut along the phantom line crossing each insulating portion into single pieces, each of the single pieces has inner leads drawn out from the through holes. Plating leads are connected to the through holes, and the plating leads are each connected to the plating wire. Therefore, through the plating wire and plating leads, electroplating can be carried out on the inner leads. Moreover, the plating wire is formed along the phantom line crossing each insulating portion. Since the substrate is cut up while cutting away the plating wire in this position, the electrical connections among the plating leads are removed, and the inner leads are also no longer electrically connected.

(25) The step of providing the substrate may include a step of forming holes in a metal plate, and a step of forming the insulating portions in the holes.

In this way, a substrate including the metal portion and the insulating portions can be obtained.

(26) The step of providing the substrate and the step of forming the wires may be carried out by: providing an adhesive that is the material for the insulating portions and the insulating layer on both surfaces of the metal plate and within the holes; applying a metal foil that is the material for the wires; and etching the metal foil.

By simply applying the metal foil with the adhesive interposed, the insulating portions can be formed simply, and the wires can be formed on the metal portion with the insulating layer interposed.

(27) According to a sixth aspect of the present invention, there is provided a method of manufacture of a substrate for a semiconductor device, comprising the steps of:

forming a hole in a metal plate, forming an insulating portion in the hole, and forming a plurality of through holes in the insulating portion.

According to this method, flatness and heat dispersion are ensured, and a substrate for a semiconductor device can be obtained in which the electrical insulation of the conductive member and the metal portion is achieved.

(28) According to a seventh aspect of the present invention, there is provided a method of manufacture of a substrate for a semiconductor device, comprising the steps of:

providing a metal plate, forming a plurality of holes around a plurality of semiconductor chip mounting regions on the metal plate, and forming an insulating portion in each of the holes;

forming a plurality of through holes on both sides of a phantom line crossing the insulating portion;

forming wires including a plating wire extending along the phantom line of the insulating portion, plating leads connecting from the plating wire to the through holes, and inner leads extending from the through holes with an insulating layer interposed to over the metal plate; and providing a conductive member within each of the through holes.

A plurality of semiconductor chips can be mounted on the metal plate, and by cutting in predetermined positions individual semiconductor devices can be fabricated, according to this method of manufacture of a substrate for a semiconductor device. A plurality of insulating portions are formed around each semiconductor chip mounting region. A plurality of through holes are formed on both sides of the phantom line crossing each insulating portion, and inner leads extend from the through holes. When this substrate is cut along the phantom line crossing each insulating portion into single pieces, each of the single pieces has inner leads drawn out from the through holes. Plating leads are connected to the through holes, and the plating leads are each connected to the plating wire. Therefore, through the plating wire and plating leads, electroplating can be carried out on the inner leads. Moreover, the plating wire is formed along the phantom line crossing each insulating portion. If in this position, the substrate is cut up using a cut wider than the width of the plating wire, the electrical connections among the plating leads are removed, and the inner leads are also no longer electrically connected.

(29) The step of forming the insulating portion and the step of forming the wires may be carried out by: providing an adhesive that is the material for the insulating portion and the insulating layer on both surfaces of the metal plate and within the holes; applying a metal foil that is the material for the wires; and etching the metal foil.

(30) According to an eighth aspect of the present invention, there is provided an electronic instrument having a circuit board on which is mounted the above described semiconductor device.

DETAILED DESCRIPTION OF THE PREFERRED EMBODIMENTS

The present invention is now described in terms of a number of preferred embodiments, with reference to the drawings.

First Embodiment

FIGS. 1A to 2B show a first embodiment of the method of manufacture of a semiconductor device according to the present invention.

Figure 1A:
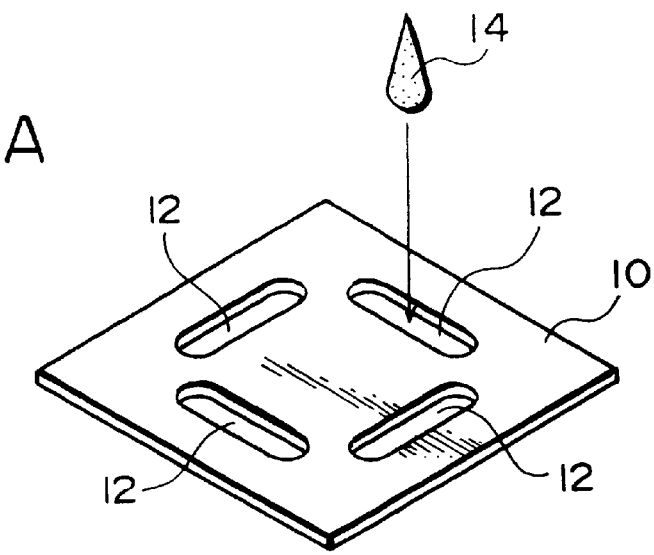
FIGS. 1A to 1C show a first embodiment of the method of manufacture of a semiconductor device according to the present invention.

First, as shown in FIG. 1A, a metal plate 10 has formed a plurality of holes (openings) 12. The metal plate 10 is formed of copper, stainless steel, aluminum, or other hard metal with relatively high electrical conductivity and thermal conductivity. On each of the surfaces of the metal plate 10 is formed an insulating layer (protective layer) 13 also functioning as a protective film (see FIG. 2B).

The holes 12 are holes (for example slots) formed along the edges of the rectangular metal plate 10. In order that adjacent holes 12 connected in error do not result in the center part of the metal plate 10 becoming detached, the holes are formed so as to avoid the corner portions of the metal plate. The holes 12 are formed, for example, by die-stamping processing.

Then the holes 12 are filled with an electrically insulating resin 14, for example by potting. As the resin 14 may be cited, for example, a ketone resin or epoxy resin.

Figure 1B:
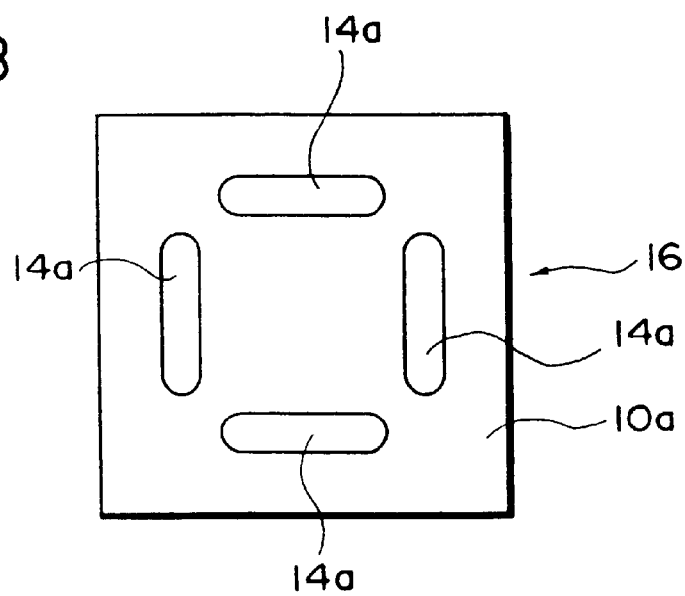

In this way, the substrate 16 shown in FIG. 1B is obtained. The substrate 16 comprises a metal portion (core layer) 10a formed from the metal plate 10, and resin portions (through hole formation portions) 14a formed from the resin 14 filling the holes 12.

Figure 1C:
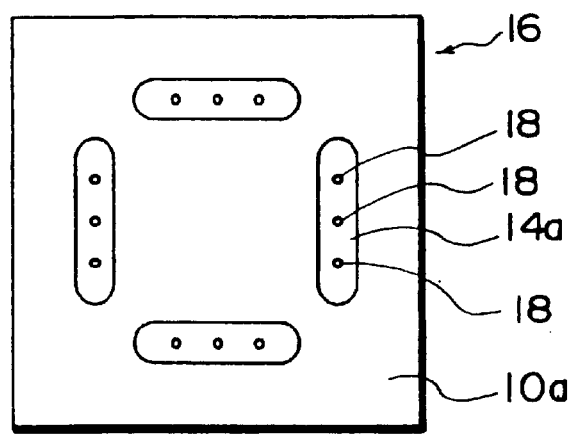

Next, as shown in FIG. 1C, in each of the resin portions 14a of the substrate 16 a plurality of through holes 18 are formed. The through holes 18 are formed, for example, using a drill or laser.

Then within the through holes 18 conductive members 20 (see FIG. 2B) are provided. The conductive members 20 are formed by subjecting the interior of the through holes 18 to electroless plating with gold or copper, and then further to electroplating with gold or copper.

Figure 2A:
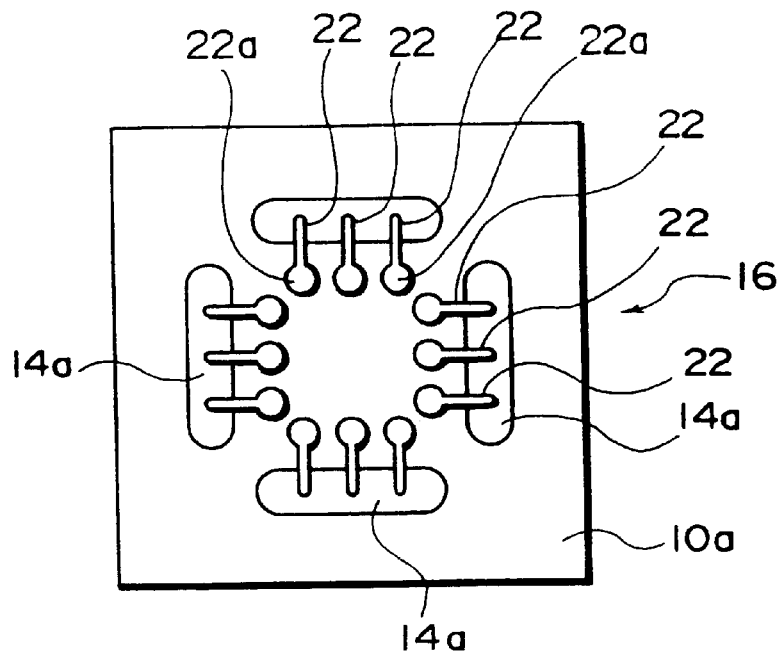
FIGS. 2A and 2B show the first embodiment of the method of manufacture of a semiconductor device according to the present invention.
Figure 2B:
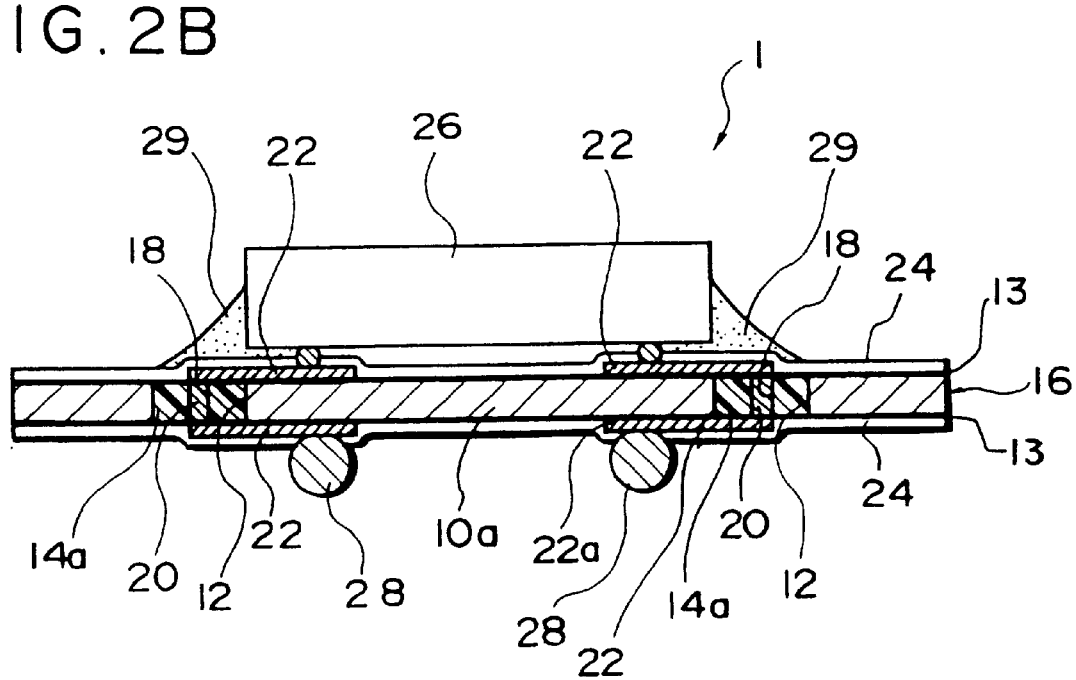

Next, as shown in FIG. 2A, on both sides of the substrate 16, wires 22 are formed on the insulating layers (See FIG. 2B). The wires 22 are connected to conductive members 20 formed in the through holes 18, and extend toward the center of the substrate 16. At the extremities of the wires 22, pads 22a are formed. In this embodiment, on both sides of the substrate 16 similar wires 22 are formed, but according to requirements the form of the wires 22 on the two sides may be made different.

It should be noted that the process of forming the conductive members 20 and the process of forming the wires 22 may equally be carried out in the reverse order.

Then as shown in FIG. 2B, a solder resist 24 is applied to both sides of the substrate 16 to avoid the pads 22a, and a semiconductor chip 26 is bonded to one side of the substrate 16, and solder balls 28 are provided as external terminals on the other side. It should be noted that the semiconductor chip 26 is attached by the face-down bonding method to the pads 22a.

Further, at the junction of the semiconductor chip 26 and substrate 16, a molding resin 29 is provided to form a seal.

The thus obtained semiconductor device 1 ensures, by means of the metal portion 10a, the flatness and heat dispersion of the substrate 16. The conductive members 20 which electrically connect wires 22 to which the semiconductor chip 26 is bonded and wires 22 on which the solder balls 28 are provided, are formed in the through holes 18 in the resin portions 14a. Therefore, by means of the resin portions 14a, the conductive members 20 and the metal portion 10a are electrically insulated. In this way, a stiffener can be omitted, as a result of which the manufacturing cost can be kept down. Since the heat dispersion of the metal portion 10a is high, a heat spreader can be omitted. However, there is no impediment to the provision of a heat spreader for further enhancing the heat dispersion performance.

The present invention is not restricted to the above-described embodiment, and various modifications are possible. For example, in this embodiment, the face-down method is used for bonding the semiconductor chip, but wire bonding may equally be applied.

Second Embodiment

Figure 3:
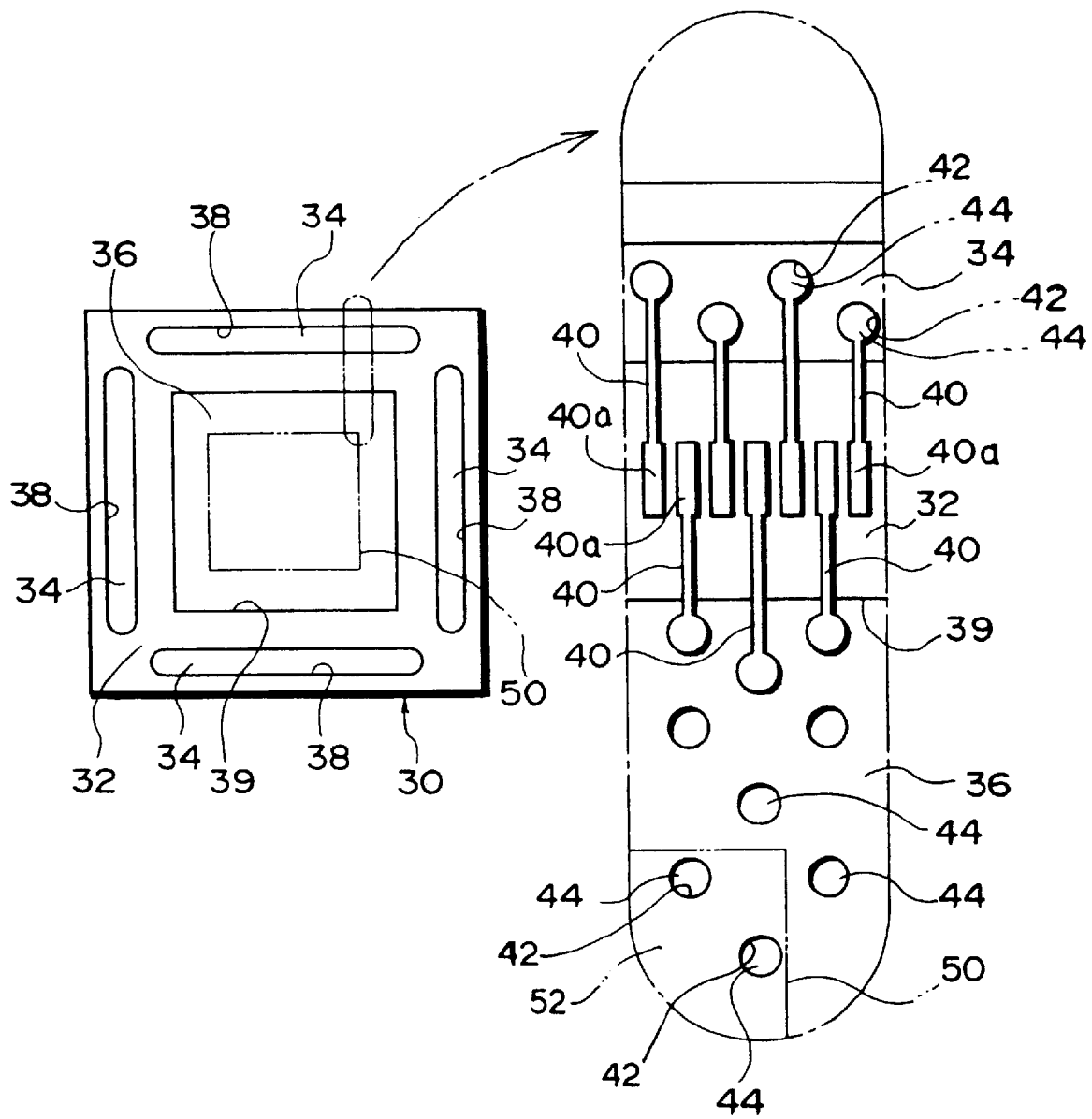
FIG. 3 shows a second embodiment of the substrate for a semiconductor device according to the present invention.

FIG. 3 shows a second embodiment of the substrate for a semiconductor device of the present invention. In this figure, a substrate 30 has a metal portion (core layer) 32 formed by die-stamping of a metal plate, and resin portions 34 and 36 (through hole formation portions). The resin portions 34 are formed by holes (slots) 38 formed along the edges of the rectangular substrate 30, filled with resin. The resin portion 36 is formed by filling a rectangular hole 39 formed in the center of the substrate 30 with resin.

In FIG. 3, a part of the substrate 30 is shown in enlargement. As shown in this enlargement, on one surface of the substrate 30 are formed a plurality of wires 40. The wires 40 are formed to extend from either of the resin portions 34 and 36 to the metal portion 32. The wires 40 have pads 40a formed on the metal portion 32.

The resin portions 34 and 36 have a plurality of through holes 42 formed aligned in a zigzag pattern, This configuration makes it possible to form a large number of the through holes 42. Each through holes 42 is provided with a conductive member 44.

On the other side of the substrate 30 are formed wires not shown in the drawings. Through the conductive members 44, these wires (not shown in the drawings) are electrically connected to the wires 40 on the opposite surface. It should be noted that in the enlargement in FIG. 3, wires 40 leading to a number of the conductive members 44 of the resin portion 36 are omitted, but in fact wires 40 are formed leading to each of the conductive members 44.

To one surface of this substrate 30 a semiconductor chip 50 is mounted, and by means of the wire bonding method the electrodes of the semiconductor chip are connected to the pads 40a. On the other side of the substrate 30, solder balls are formed on pads formed on the wires but not shown in the drawings. In this way, using the substrate 30 a semiconductor device can be fabricated.

It should be noted that at least one through hole 42 and one conductive member 44 are positioned below the semiconductor chip 50. Since through holes 42 and conductive members 44 can be formed below the semiconductor chip 50, a large number of through holes 42 and conductive members 44 can be provided. Then even when the semiconductor chip 50 has a large number of electrodes, a large number of wires 40 and a large number of conductive members conductively connected thereto can be formed. The semiconductor chip 50 is connected to the through holes 42 through a thermally conductive adhesive 52. In this case, the through holes 42 serve as an air escape, and also function to cool the heat transmitted through the adhesive 52.

According to this embodiment also, by means of the metal portion 32, flatness and heat dispersion of the substrate 30 are ensured. The conductive members 44 can be electrically insulated from the metal portion 32 by the resin portions 34 and 36. Other details are the same as in the first embodiment.

In this embodiment, the wire bonding method is given as an example for bonding the semiconductor chip, but the face-down method may equally be used for bonding of the semiconductor chip.

Third Embodiment

Figure 4:
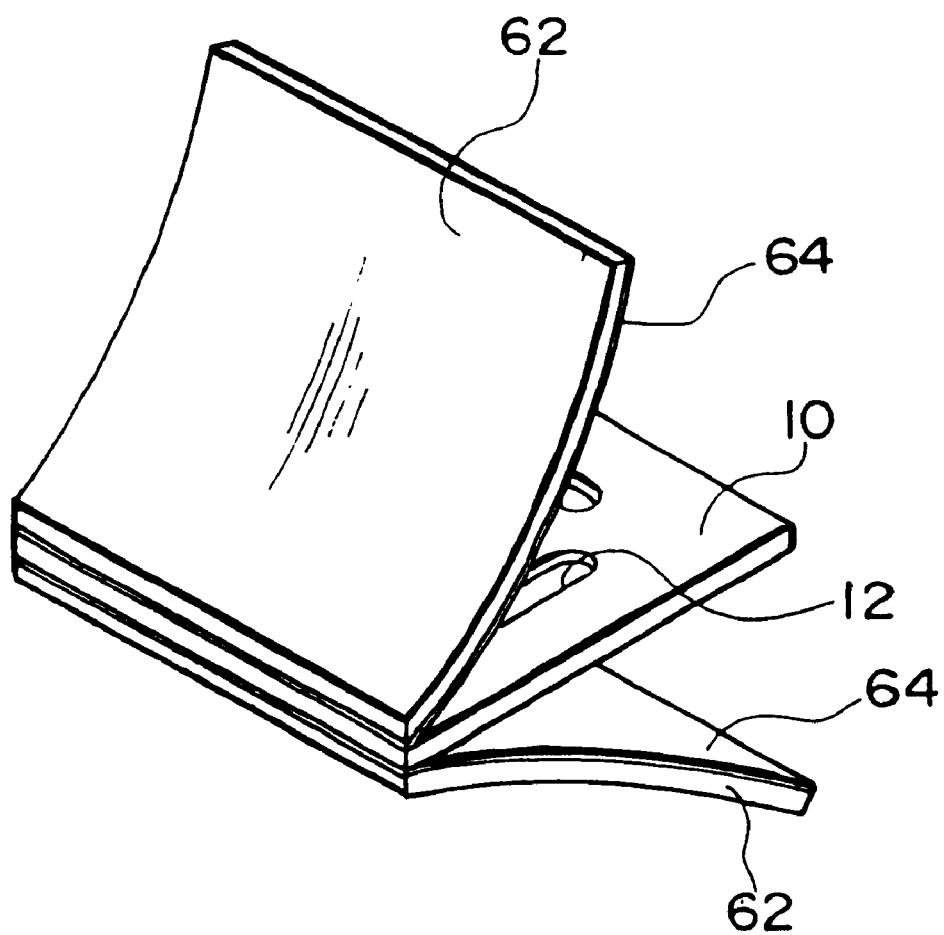
FIG. 4 shows a third embodiment of a method of manufacture of the substrate for a semiconductor device according to the present invention.

FIG. 4 shows a third embodiment of the method of manufacture of the substrate for a semiconductor device according to the present invention. In this embodiment, wiring members (metal foils) 62 are adhered to the metal plate 10 in place of the step in FIG. 1A, as shown in FIG. 4. An insulating adhesive 64 is previously applied to the wiring members 62. More specifically, the metal plate 10 is clamped between the wiring members 62, and the wiring members are adhered by the application of pressure, of at least 5 kg/mm$^2$, for example. It should be noted that as the adhesive 64 may be used a ketone resin or epoxy resin or the like, and as the wiring member 62 is preferably used a conventional substrate material such as copper, aluminum, or the like.

According to this embodiment, when the wiring members 62 are adhered, the previously applied adhesive 64 enters the holes (openings) 12 in the metal plate 10. The adhesive 64 which has entered the holes 12 is insulating, and it forms a resin portion (through hole formation portion). The adhesive 64 also forms an insulating layer covering the metal plate 10.

Then after the adhesive 64 has been solidified, through holes are formed in the same way as in FIG. 1C, the wiring members 62 are etched to form wires, and by making the interior of the through holes conductive, the wires on both sides of the metal plate 10 are electrically connected, whereby a substrate similar to that shown in FIG. 2A is obtained.

According to this embodiment, the step of adhering the wiring members 62 is combined with the step of forming the resin portions (through hole formation portions), as a result of which the number of steps can be reduced. The metal plate 10 has the insulating layer 13 (see FIG. 2B), but a metal plate not having an insulating layer can also be used. In this case, the adhesive 64 forms an insulating layer.

Fourth Embodiment

Figure 5:
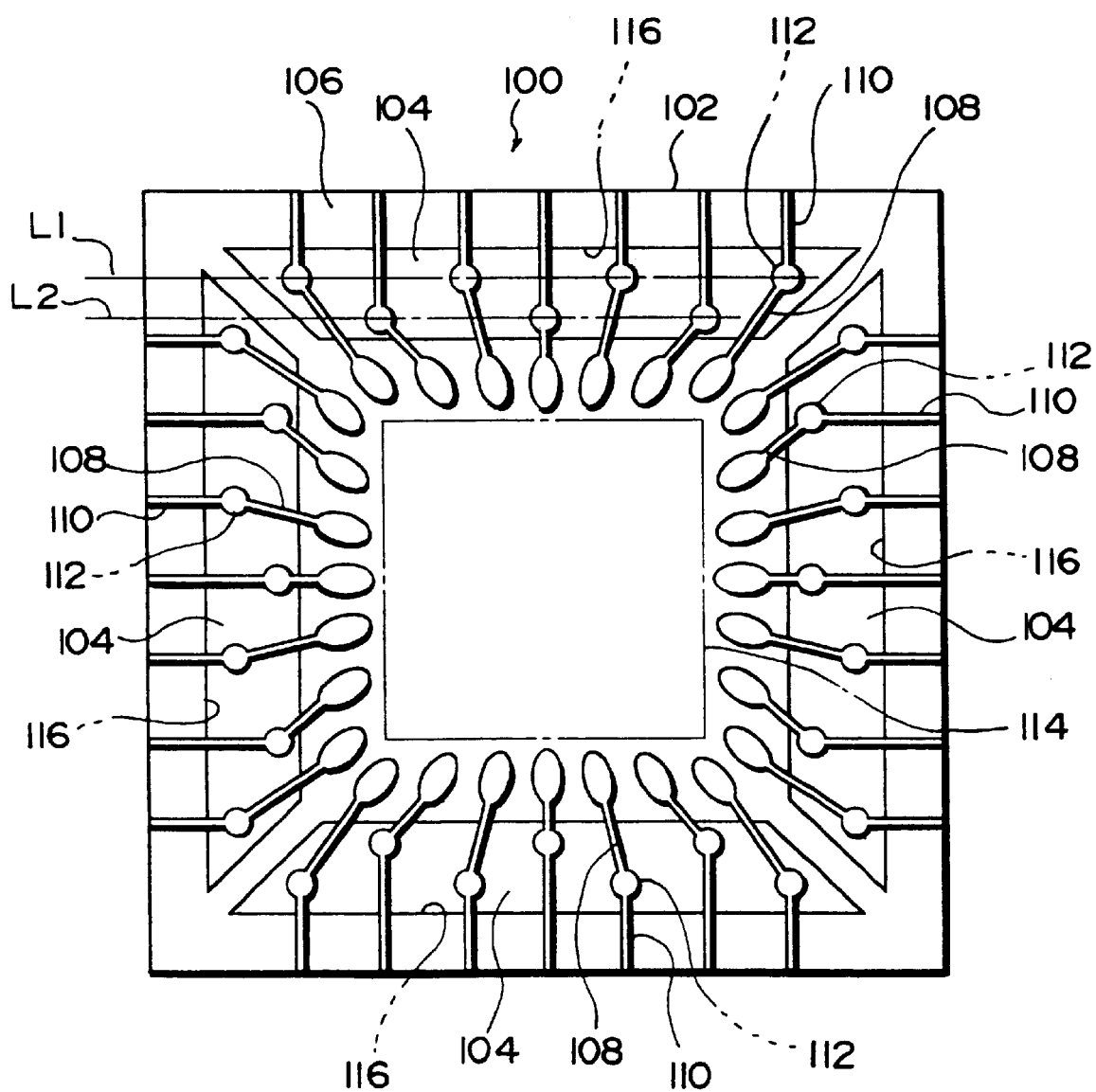
FIG. 5 shows a fourth embodiment of the substrate for a semiconductor device according to the present invention.

FIG. 5 shows a fourth embodiment of the substrate for a semiconductor device according to the present invention. This substrate for a semiconductor device 100 includes a metal portion (core layer) 102, through hole formation portions 104 formed in a plurality of locations in the metal portion 102, an insulating layer 106 covering the surface of the metal portion 102, and wires including inner leads 108 and plating leads 110.

The metal portion 102 is formed from a metal plate in which openings 116 are formed. The openings 116 are filled with an insulating material, to form the through hole formation portions 104. As the insulating material may be used a resin, and in this case, the through hole formation portions 104 are resin portions.

The substrate for a semiconductor device 100 has in its central portion a mounting region 114 for a semiconductor chip, and a plurality of through hole formation portions 104 are formed around the semiconductor chip mounting region. For example, corresponding to a rectangular semiconductor chip, through hole formation portions 104 are formed positioned along the edges of the rectangle. Adjacent through hole formation portions 104 form an L-shape. It should be noted that intervals are provided so that adjacent through hole formation portions 104 are not continuous. Since these intervals are kept to the minimum size, the size of the through hole formation portions 104 can be increased.

Each of the through hole formation portions 104 is formed in the periphery of the metal portion 102 to extend longitudinally along the sides of the metal portion 102. When the metal portion 102 is rectangular, the through hole formation portions 104 extend longitudinally along the sides of the rectangle. The through hole formation portions 104 are longer in extent on the peripheral side than on the side toward the center region of the metal portion 102. That is to say, each of the through hole formation portions 104 has a trapezoidal shape in which the outer side is longer than the inner side. In particular, when adjacent through hole formation portions 104 form an L-shape, naturally the inside of the L-shape is more restricted in extent than the outside, the extremities of adjacent through hole formation portions 104 can be brought close together.

Since each of the through hole formation portions 104 is of the above-described form, the openings 116 also take the same form. A plurality of through holes 112 are formed in each of the through hole formation portions 104. The through holes 112 are aligned along either of a plurality of lines L1 and L2 extending along the longitudinal direction of the through hole formation portions 104. The lines L1 and L2 can be made straight lines. One of lines L1 and L2 is positioned in one of the through hole formation portions 104 close to the outside of the metal portion 102, and the other is positioned in the same through hole formation portion but close to the center of the metal portion 102. The through holes 112 on one of lines L1 and L2 and the through holes 112 on the other of lines L1 and L2 are positioned so as not to be aligned in a straight line intersecting lines L1 and L2. That is to say, the through holes 112 are positioned in zigzag. By this means, when the inner leads 108 and plating leads 110 are formed extending toward the center or toward the exterior, they do not obstruct other through holes 112.

As described above, since the through hole formation portions 104 form a trapezoidal shape, the number of through holes 112 on the line L1 close to the longer edge of the trapezoid can be made more than the number of through holes 112 on the line L2 close to the shorter edge of the trapezoid. The through holes 112 are provided with conductive members not shown in the drawings.

The inner leads 108 are formed to extend from the through holes 112 toward the center portion of the metal portion 102. The inner leads 108 are formed to extend beyond the through hole formation portions 104. In the case that wire bonding is applied, the inner leads 108 are formed to a point short of the semiconductor chip mounting region 114. The extremities of the inner leads 108 are formed enlarged, for use as pads for wire bonding. Since the through holes 112 form a zigzag, the inner leads 108 extending from the through holes 112 positioned close to the periphery of the metal portion 102 can be formed toward the center portion while avoiding the through holes 112 positioned close to the center of the metal portion 102. The metal portion 102 is covered by the insulating layer 106, and the inner leads 108 are formed on the insulating layer 106, so that electrical insulation from the metal portion 102 can be achieved.

The plating leads 110 are formed to extend from the through holes 112 toward the periphery of the metal portion 102. The plating leads 110 serve for carrying out plating of the inner leads 108 and also for carrying out plating within the through holes 112 to form conductive members. The plating leads 110 are formed to extend beyond the through hole formation portions 104, and reach the edges of the metal portion 102. Since the through holes 112 are disposed in zigzag, the plating leads 110 extending from the through holes 112 positioned toward the center of the metal portion 102 can be formed to extend outward while avoiding the through holes 112 positioned close to the periphery of the metal portion 102. The metal portion 102 is covered by the insulating layer 106, and the plating leads 110 are formed on the insulating layer 106, as a result of which electrical insulation from the metal portion 102 can be achieved.

It should be noted that in FIG. 5, only one surface of the substrate for a semiconductor device 100 is shown, and on the other surface wires similar to those of the first embodiment are formed. Then through conductive members formed within the through holes 112 the wires on the two surfaces are connected together.

This embodiment is constructed as described above, and may be fabricated by the methods described in the first and third embodiments. Moreover, in the mounting region 114 of the semiconductor chip in the substrate for a semiconductor device 100, a semiconductor chip is mounted, and the electrodes of the semiconductor chip and the pads of the inner leads 108 are wire-bonded. On the surface opposite to that of the semiconductor chip, external terminals are provided. In this way, a semiconductor device can be manufactured. It should be noted that the semiconductor chip may equally be subjected to face-down bonding.

Fifth Embodiment

Figure 6:
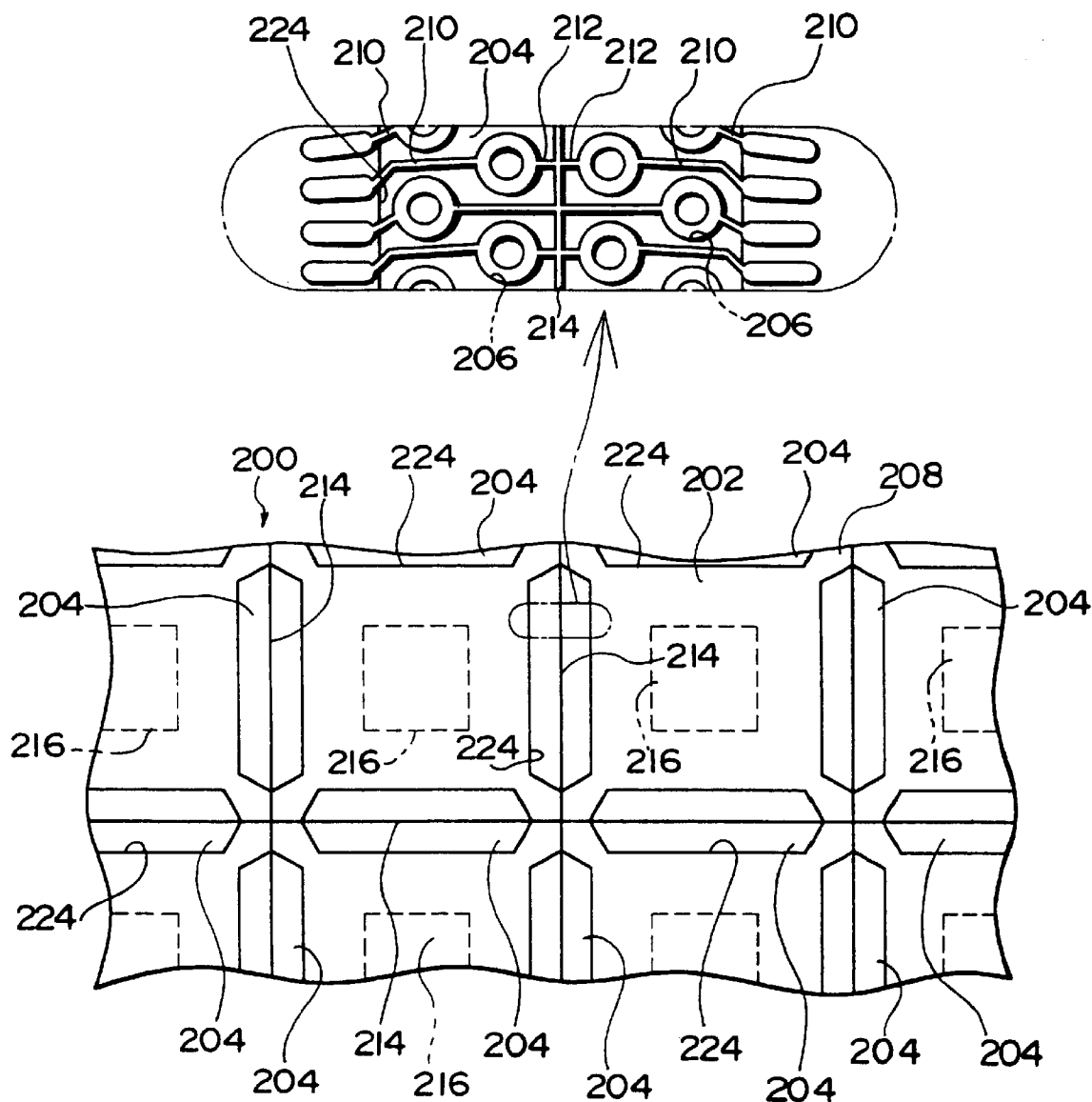
FIG. 6 shows a fifth embodiment of the substrate for a semiconductor device according to the present invention.

FIG. 6 shows a fifth embodiment of the substrate for a semiconductor device according to the present invention. A substrate for a semiconductor device 200 includes a metal portion (core layer) 202, a plurality of through hole formation portions 204 formed in a plurality of locations in the metal portion 202, an insulating layer 208 covering the surface of the metal portion 202, and wires including inner leads 210, plating leads 212, and plating wires 214.

Figure 7:
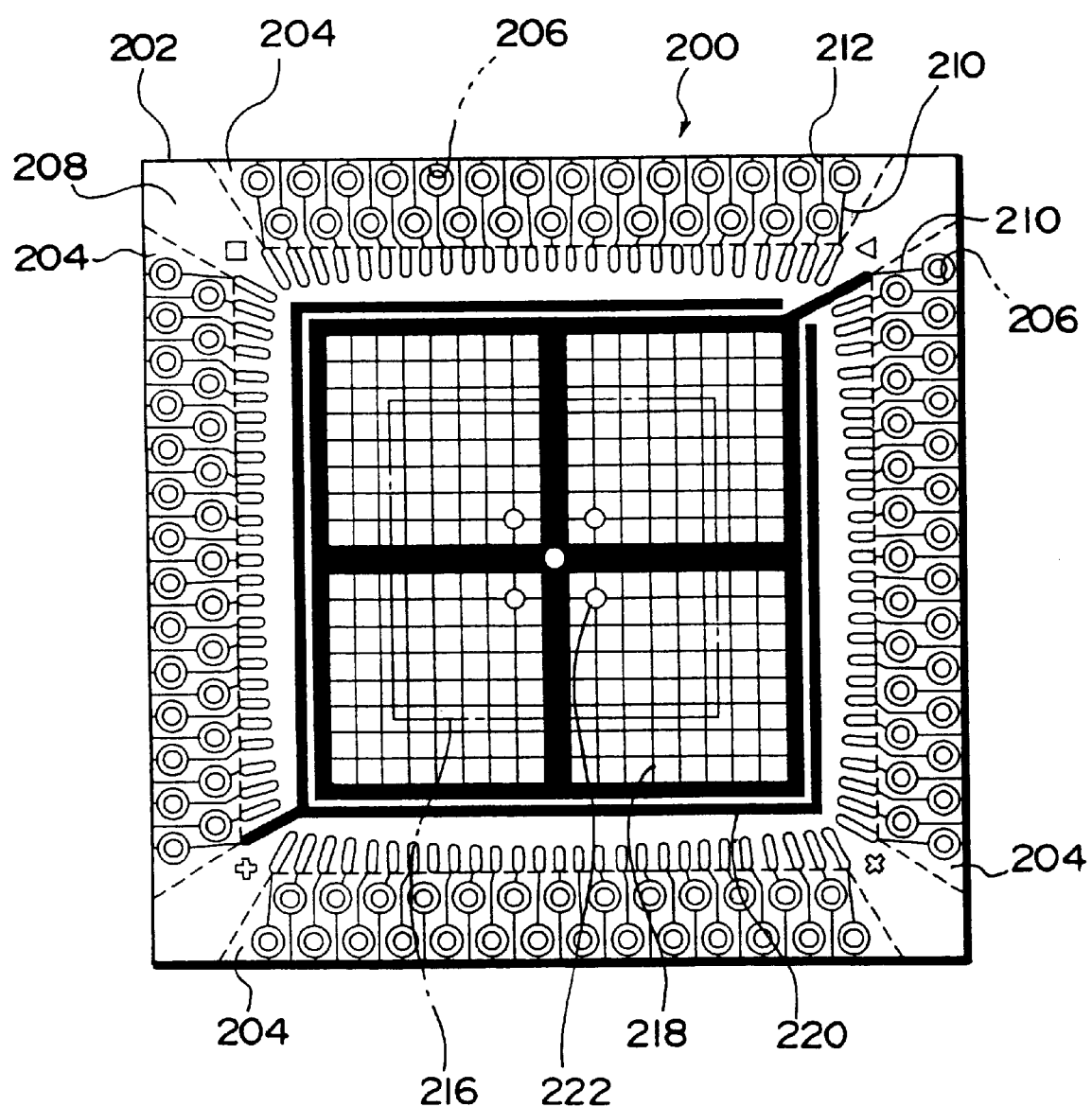
FIG. 7 shows a single piece cut from the fifth embodiment of the substrate for a semiconductor device according to the present invention.
Figure 8:
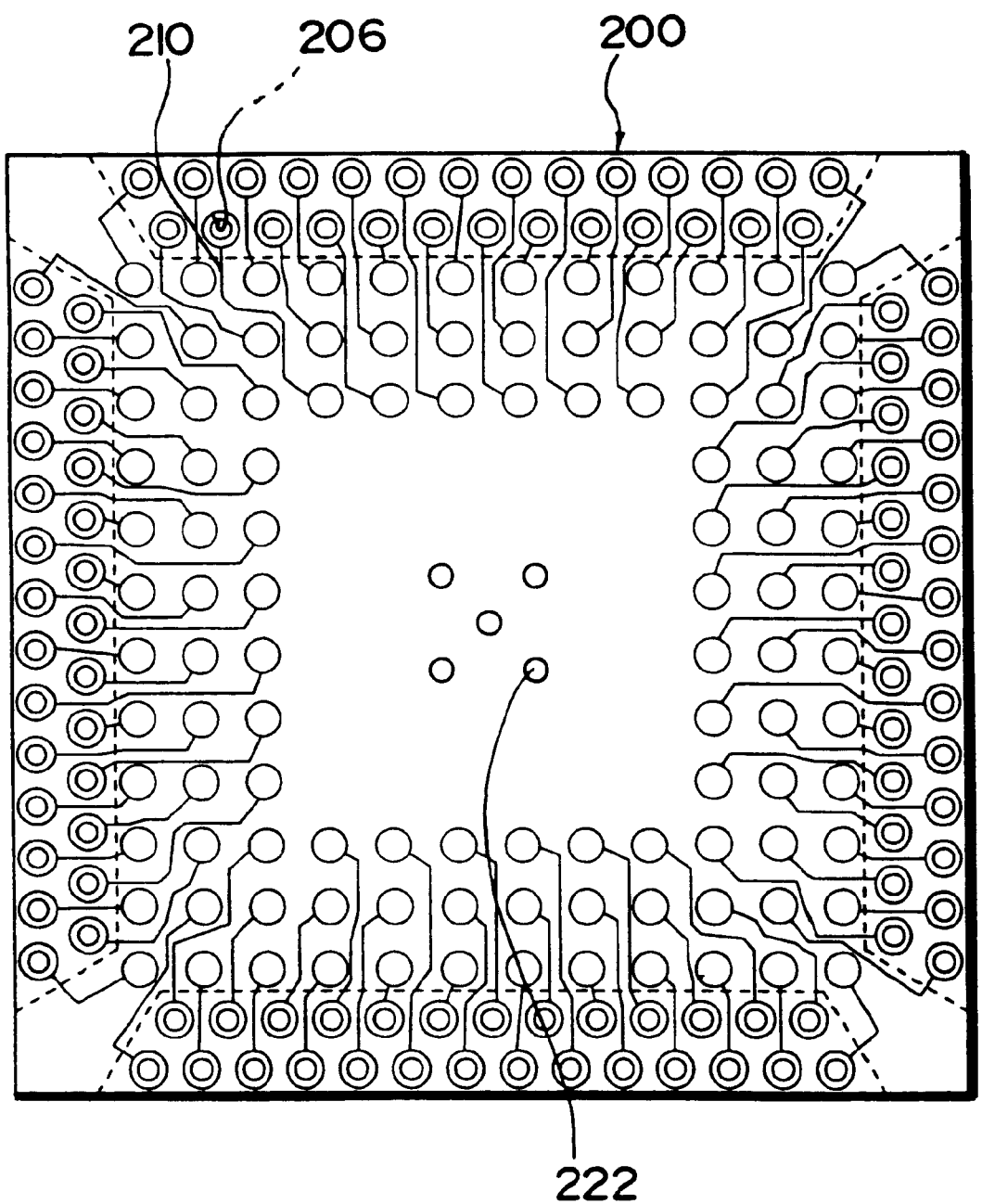
FIG. 8 shows a single piece cut from the fifth embodiment of the substrate for a semiconductor device according to the present invention.
Figure 9:
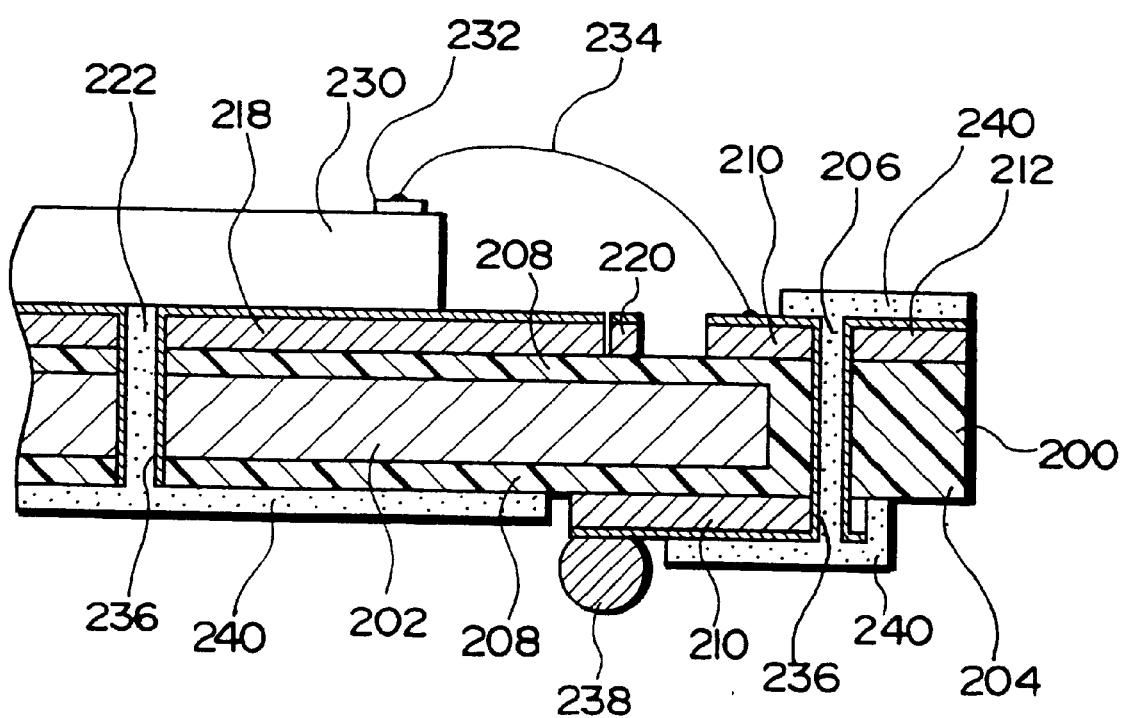
FIG. 9 shows a semiconductor device fabricated using the fifth embodiment of the substrate for a semiconductor device according to the present invention.

The substrate for a semiconductor device 200 has a plurality of mounting regions 216 for semiconductor chips. That is to say, the substrate for a semiconductor device 200 is cut into a plurality of single pieces, and each of the single pieces has a semiconductor chip mounted. FIG. 7 shows one surface of a single piece cut from the substrate for a semiconductor device 200, and FIG. 8 shows the other surface. Then FIG. 9 shows a semiconductor device obtained by mounting a semiconductor chip on a single piece cut from the substrate for a semiconductor device.

Each of the semiconductor chip mounting regions 216 is surrounded by through hole formation portions 204. When the semiconductor chip is rectangular, corresponding to this shape the through hole formation portions 204 are formed in positions corresponding to the sides of the rectangle.

The metal portion 202 is formed from a metal plate in which openings 224 are formed. The openings 224 are holes formed in the metal portion 202. The through hole formation portions 204 are formed by filling the openings 224 with an insulating material. As the insulating material may be used a resin, and in this case, the through hole formation portions are resin portions. The through hole formation portions 204 are formed, as two of the trapezoidal through hole formation portions 104 shown in FIG. 5 with their longer edges abutted, making an elongated hexagonal shape. Therefore, one half of each of the through hole formation portions 204 achieves a similar effect to one of the through hole formation portions 104 shown in FIG. 5.

When the semiconductor chip mounting regions 216 form a rectangular shape, of the through hole formation portions 204 surrounding the mounting regions 216, adjacent through hole formation portions 204 form an L-shape. It should be noted that intervals are provided so that adjacent through hole formation portions 204 are not connected. Since these intervals are kept to the minimum size, the size of the through hole formation portions 204 can be increased.

In each of the through hole formation portions 204, a plurality of through holes 206 is formed. The layout of the through holes 206 is the same as the layout of the through holes 112 shown in FIG. 5. That is to say, each of the through holes 206 is positioned on one of a plurality of lines (not shown in the drawings) extending in the longitudinal direction of the through hole formation portions 204. The through holes 206 are disposed in a zigzag formation. Other details are the same as described in the fourth embodiment, and the effects are the same.

In each of the through hole formation portions 204, a plating wire 214 is formed. Each of the through hole formation portions 204 is of elongated hexagonal shape, and on a phantom line extending in the longitudinal direction in for example the center region in the lateral direction, a plating wire 214 is formed. The plating wire 214 is used for carrying out plating in particular locations.

The inner leads 210 are formed to extend from the through holes 206 in the direction opposite to that of the plating wires 214, toward the semiconductor chip mounting regions 216. The inner leads 210 are formed to extend beyond the through hole formation portions 204. When wire bonding is applied, the inner leads 210 are formed to just short of the semiconductor chip mounting regions 216. The extremities of the inner leads 210 are enlarged as pads for wire bonding. The metal portion 202 is covered by the insulating layer 208, and the inner leads 210 are formed on the insulating layer 208, as a result of which electrical insulation from the metal portion 202 is achieved.

The plating leads 212 are formed to extend from the through holes 206 toward the plating wires 214, and the plating wires 214 and plating leads 212 are connected together. By this means, since the plating wires 214, plating leads 212, and inner leads 210 are electrically connected, conductive material 236 (see FIG. 9) can be formed by carrying out plating of the inner leads 210 and carrying out plating of the interior of the through holes 206 through the plating wires 214.

The principal part of the substrate for a semiconductor device 200 is of the above-described construction, and by cutting this the single piece substrate shown in FIGS. 7 and 8 is obtained. More specifically, the substrate for a semiconductor device 200 is cut along the plating wires 214 shown in FIG. 6 into single pieces. For example, if the plating wires 214 have a width of approximately 80 μm, then using a dicer with a blade thickness of approximately 160 μm, then by cutting along the plating wires 214, even considering the accuracy tolerance of the dicer the plating wires 214 can be cut and removed while carrying out the cutting operation.

The inner leads 210 and plating leads 212 extend from through holes 206, and the plating leads 212 are connected to the plating wires 214, so that by removing the plating wires 214, the inner leads 210 can be made no longer mutually electrically connecting.

A single piece thus obtained has the above described inner leads 210 on one surface, as shown in FIG. 7. On the other surface, the inner leads 210 extend from the through holes 206 as shown in FIG. 8, and pads are formed at the extremities of the inner leads 210. These pads are used to provide external terminals. The inner leads 210 on one surface and the inner leads 210 on the other surface are electrically connected by means of the conductive material 236 (see FIG. 9) provided within the through holes 206.

As shown in FIG. 7, on one surface of the substrate for a semiconductor device 200 a network conductive pattern 218 is formed. The conductive pattern 218 is formed in a region including the semiconductor chip mounting regions 216, and is connected through the inner leads 210 to the through holes 206, and through the conductive material 236 (see FIG. 9) within the through holes 206, is further connected to the inner leads 210 on the other surface, and through pads on the extremities thereof, is further connected to the external terminals 238 (see FIG. 9). The periphery of the conductive pattern 218 has a frame-shape portion, and as a result, wire bonding to this frame-shape portion from electrodes 232 of a semiconductor chip 230 (see FIG. 9) mounted on the conductive pattern 218 is possible. Since this frame-shaped peripheral portion surrounds the semiconductor chip 230, wire bonding is possible from the electrodes 232 in any position. The conductive pattern 218 is, for example, at ground potential.

The conductive pattern 218 is electrically connected to the metal portion 202 via through holes 222 passing through the metal portion 202. That is to say, a part of the conductive pattern 218 is formed to reach the openings of the through holes 222, and since plating is carried out on the surface of the conductive pattern 218 and the interior of the through holes 222, this plating acts as the conductive material 236 (see FIG. 9), and the conductive pattern 218 and the metal portion 202 are electrically connected. Therefore, since the relatively large metal portion 202 is electrically connected to the conductive pattern 218, its capacitance is increased, and the potential is stabilized.

Around the conductive pattern 218, so as not to be conducting thereto, a separate conductive pattern 220 is formed. This conductive pattern 220 also is formed to surround the semiconductor chip 230 (see FIG. 9), except for a region avoiding a part of the conductive pattern 218, and therefore wire bonding is possible from the electrodes 232 in any position. The conductive pattern 220 is, for example, at a power supply potential.

FIG. 9 shows a semiconductor device obtained by utilizing the single piece as described above cut from the substrate for a semiconductor device 200. As shown in this figure, on the substrate for a semiconductor device 200, the semiconductor chip 230 is mounted, and any one of the electrodes 232 is connected with one of the inner leads 210 by a wire 234. Other one of the electrodes 232 and conductive pattern 218 and 220 are also connected by another wire (not shown in the drawings). By plating of the surface of the inner leads 210, the surface of the conductive patterns 218 and 220, and the interior of the through holes 206 and 222, the conductive material 236 is formed. On the surface opposite to that on which the semiconductor chip 230 is mounted, pads are formed at the extremities of the inner leads 210, to provide external terminals 238 of for example solder balls or the like. Because of this construction, each of the electrodes 232 of the semiconductor chip 230 is connected to one of the external terminals 238.

In a region excluding at least the pads for providing external terminals 238, a protective material 240 such as a solder resist is provided. This protective material 240 may penetrate the interior of the through holes 206 and 222.

This embodiment is constructed as described above, and its method of manufacture is now described. In this embodiment, either of the first and second embodiments of the method of manufacture may be applied, but the second embodiment will be described by way of example.

In this case, first, holes are formed in a metal plate corresponding to the openings 224, to define the metal portion 202. Then a metal foil to which an adhesive has been previously applied is adhered to both surfaces of the metal portion 202 and a particular pressure applied. In this way, in the openings 224 in the metal portion 202 a resin portion is formed from the adhesive, and this region constitutes the through hole formation portions 204. On both surfaces of the metal portion 202 the insulating layers 208 are formed from the adhesive.

Next, in the above-described positions through holes 206 and 222 are formed. The metal foil is etched, and wires including the inner leads 210, plating leads 212, plating wires 214, and conductive patterns 218 and 220 are formed. Next, a pretreatment fluid for plating is applied, and thereafter plating is applied to the wire surface and to the interior surface of through holes 220 and 222, to provide the conductive material 236. It should be noted that since the through holes 206 are formed in the through hole formation portions 204 formed of an insulating material, even when plating is carried out on the interior surface of the through holes 206, there is no electrical conductivity between the conductive material 236 and the metal portion 202. In contrast, since the through holes 222 are formed to penetrate the metal portion 202, when plating is carried out, the conductive material 236 and metal portion 202 are electrically connected.

In this way, the substrate for a semiconductor device 200 shown in FIG. 6 is obtained. Next, by cutting away the plating wires 214, the substrate for a semiconductor device 200 is cut up. By means of this step, the single pieces shown in FIGS. 7 and 8 are obtained, and the plating wires 214 are removed, so that the electrical connections among the inner leads 210 are no longer present.

Then, as shown in FIG. 9, the semiconductor chip 230 is mounted in the mounting regions 216, and wire bonding is carried out. Additionally, the protective material 240 is applied in particular locations, and furthermore if necessary, a region including the wires 234 may be sealed with resin. By means of the above steps the semiconductor device can be obtained. It should be noted that in this embodiment also, in place of wire bonding, face-down bonding may equally be applied.

Figure 10:
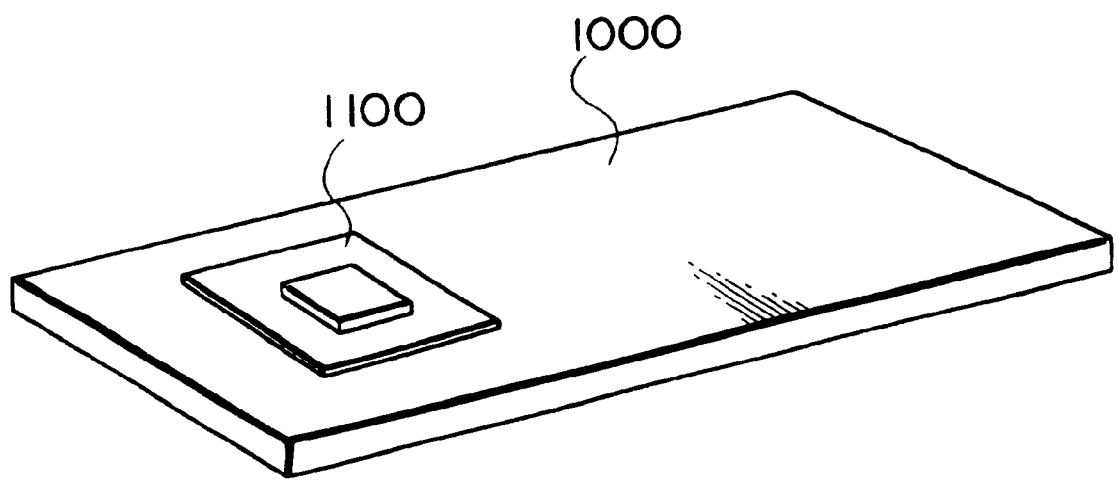
FIG. 10 shows a circuit board on which is mounted a semiconductor device to which the present invention is applied.

In FIG. 10 is shown a circuit board 1000 on which is mounted a semiconductor device 1100 fabricated by the method according to the present invention. For the circuit board is generally used an organic substrate such as a glass epoxy substrate or the like. On the circuit board, a wiring pattern of for example copper or the like is formed to constitute a desired circuit, and this wiring pattern and bumps of the semiconductor device are mechanically connected, to achieve the electrical conductivity.

Figure 11:
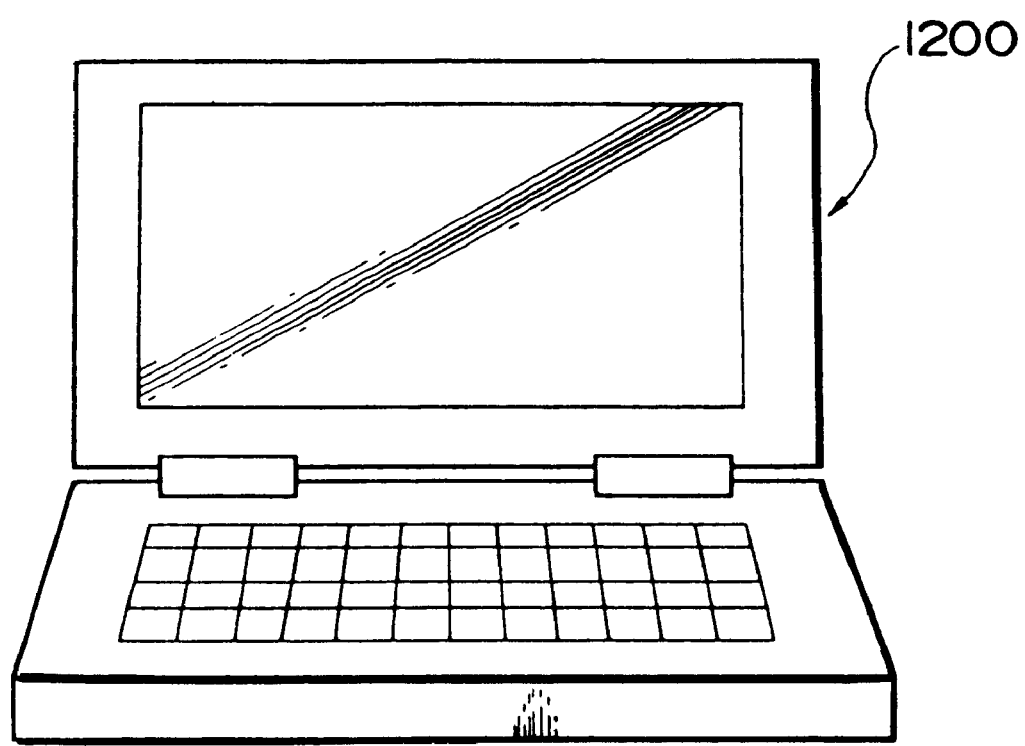
FIG. 11 shows an electronic instrument relating to the present invention.

Next, as an electronic instrument provided with this circuit board 1000, FIG. 11 shows a notebook personal computer 1200.

It should be noted that the present invention is applied to technology relating to a semiconductor device, but the present invention can also be applied to an integrated circuit device using other than a semiconductor material.

What is claimed is:

1. A method of manufacture of a semiconductor device, comprising the steps of:

providing a substrate including a metal portion and an insulating portion, said metal portion having an opening formed therein, the insulation portion provided in said opening;

forming a plurality of through holes in said insulating portion;

providing a conductive member within each of said through holes;

attaching a semiconductor chip to one surface of said substrate;

providing external terminals on the other surface of said substrate; and forming wires electrically connecting said semiconductor chip and said external terminals through said conductive member, with an insulating layer interposed over said metal portion.

2. A method of manufacture of a semiconductor device, comprising the steps of:

providing a substrate including a metal portion and an insulating portion;

forming a plurality of through holes in said insulating portion;

providing a conductive member within each of said through holes;

attaching a semiconductor chip to one surface of said substrate;

providing external terminals on the other surface of said substrate; and forming wires electrically connecting said semiconductor chip and said external terminals through said conductive member, with an insulating layer interposed over said metal portion, wherein the step of providing said substrate includes a step of forming a hole in a metal plate, and a step of forming said insulating portion in said hole.

3. The method of manufacture of a semiconductor device as defined in claim 2, wherein the step of providing said substrate and the step of forming said wires are carried out by:

providing an adhesive that is the material for said insulating portion and said insulating layer on both surfaces of said metal plate and within said holes;

applying a metal foil that is the material for said wires; and etching said metal foil.

4. A method of manufacture of a semiconductor device comprising the steps of:

providing a substrate including a metal portion having a plurality of semiconductor chip mounting regions, and a plurality of insulating portions formed around each of said semiconductor chip mounting regions;

forming a plurality of through holes on both sides of a phantom line crossing each of said insulating portions;

forming wires including a plating wire extending along said phantom line of each of said insulating portions, plating leads connecting from said plating wire to said through holes, and inner leads extending from said through holes with an insulating layer interposed to over said metal portion;

providing a conductive member within each of said through holes;

attaching a plurality of semiconductor chips to one surface of said substrate and connecting electrodes of each of said semiconductor chips to said inner leads; and cutting said substrate into a plurality of single pieces while cutting away said plating wire.

5. The method of manufacture of a semiconductor device as defined in claim 4, wherein the step of providing said substrate includes a step of forming holes in a metal plate, and a step of forming said insulating portions in said holes.

6. The method of manufacture of a semiconductor device as defined in claim 5, wherein the step of providing said substrate and the step of forming said wires are carried out by:
  providing an adhesive that is the material for said insulating portions and said insulating layer on both surfaces of said metal plate and within said holes;
  applying a metal foil that is the material for said wires; and
  etching said metal foil.

7. A method of manufacture of a substrate for a semiconductor device, comprising the steps of:
  forming a hole in a metal plate, forming an insulating portion in said hole, and forming a plurality of through holes in said insulating portion.

8. A method of manufacture of a substrate for a semiconductor device, comprising the steps of:
  providing a metal plate, forming a plurality of holes around a plurality of semiconductor chip mounting regions on said metal plate, and forming an insulating portion in each of said holes;
  forming a plurality of through holes on both sides of a phantom line crossing said insulating portion;
  forming wires including a plating wire extending along said phantom line of said insulating portion, plating leads connecting from said plating wire to said through holes, and inner leads extending from said through holes with an insulating layer interposed to over said metal plate; and
  providing a conductive member within each of said through holes.

9. The method of manufacture of a substrate for a semiconductor device as defined in claim 8,
  wherein the step of forming said insulating portion and the step of forming said wires are carried out by:
    providing an adhesive that is the material for said insulating portion and said insulating layer on both surfaces of said metal plate and within said holes;
    applying a metal foil that is the material for said wires; and
    etching said metal foil.

* * * * *